United States Patent
Cavoretto

(10) Patent No.: US 7,242,173 B2
(45) Date of Patent: Jul. 10, 2007

(54) COMBINED TEST INSTRUMENT PROBE AND VOLTAGE DETECTOR

(75) Inventor: James L. Cavoretto, Woodinville, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 10/930,188

(22) Filed: Aug. 31, 2004

(65) Prior Publication Data

US 2006/0043959 A1 Mar. 2, 2006

(51) Int. Cl.
*G01R 19/155* (2006.01)
*G01R 1/06* (2006.01)

(52) U.S. Cl. .................................. 324/72.5; 324/754
(58) Field of Classification Search ............... 324/72.5, 324/754, 149, 133
See application file for complete search history.

(56) References Cited

U.S. PATENT DOCUMENTS

| | | | | |
|---|---|---|---|---|
| 1,831,372 A * | 11/1931 | Spangler | ..................... | 324/552 |
| 2,946,002 A * | 7/1960 | Russell | ..................... | 324/409 |
| 3,437,928 A * | 4/1969 | Baker et al. | ..................... | 324/133 |
| 3,555,420 A | 1/1971 | Schwartz | ..................... | 324/72.5 |
| 3,919,631 A | 11/1975 | Brown | ..................... | 324/556 |
| 4,006,409 A | 2/1977 | Adams | ..................... | 324/510 |
| 4,079,314 A | 3/1978 | Jone | ..................... | 324/149 |
| 4,259,635 A | 3/1981 | Triplett | ..................... | 324/149 |
| 5,075,621 A * | 12/1991 | Hoyt | ..................... | 324/762 |
| 5,103,165 A | 4/1992 | Sirattz | ..................... | 324/133 |
| 5,444,194 A * | 8/1995 | Reinke | ..................... | 181/150 |
| 5,612,616 A * | 3/1997 | Earle | ..................... | 324/72.5 |
| 5,877,618 A * | 3/1999 | Luebke et al. | ..................... | 324/72.5 |
| 6,137,285 A * | 10/2000 | Walsten et al. | ..................... | 324/133 |
| 6,323,638 B2 * | 11/2001 | McNulty | ..................... | 324/149 |
| 6,377,054 B1 | 4/2002 | Beha | ..................... | 324/510 |
| 6,605,934 B1 * | 8/2003 | Campbell et al. | ..................... | 324/72.5 |
| 6,812,685 B2 * | 11/2004 | Steber et al. | ..................... | 324/72.5 |
| 2002/0135349 A1 * | 9/2002 | Steber et al. | ..................... | 324/72.5 |
| 2004/0012380 A1 | 1/2004 | Van Deursen et al. | ..................... | 324/72.5 |

FOREIGN PATENT DOCUMENTS

EP 1351062 A2 10/2003

OTHER PUBLICATIONS

IEEE 100 The Authoritive Dictionary of IEEE Standard Terms 7th Edition (IEEE Press), p. 869.*

* cited by examiner

*Primary Examiner*—Anjan Deb
(74) *Attorney, Agent, or Firm*—Richard A. Koske; George T. Noe; James H. Walters

(57) ABSTRACT

A voltage detector is combined with a test instrument probe to provide an indication of the presence of a.c. voltage when the test instrument probe approaches or comes in contact with a source of a.c. voltage.

5 Claims, 3 Drawing Sheets

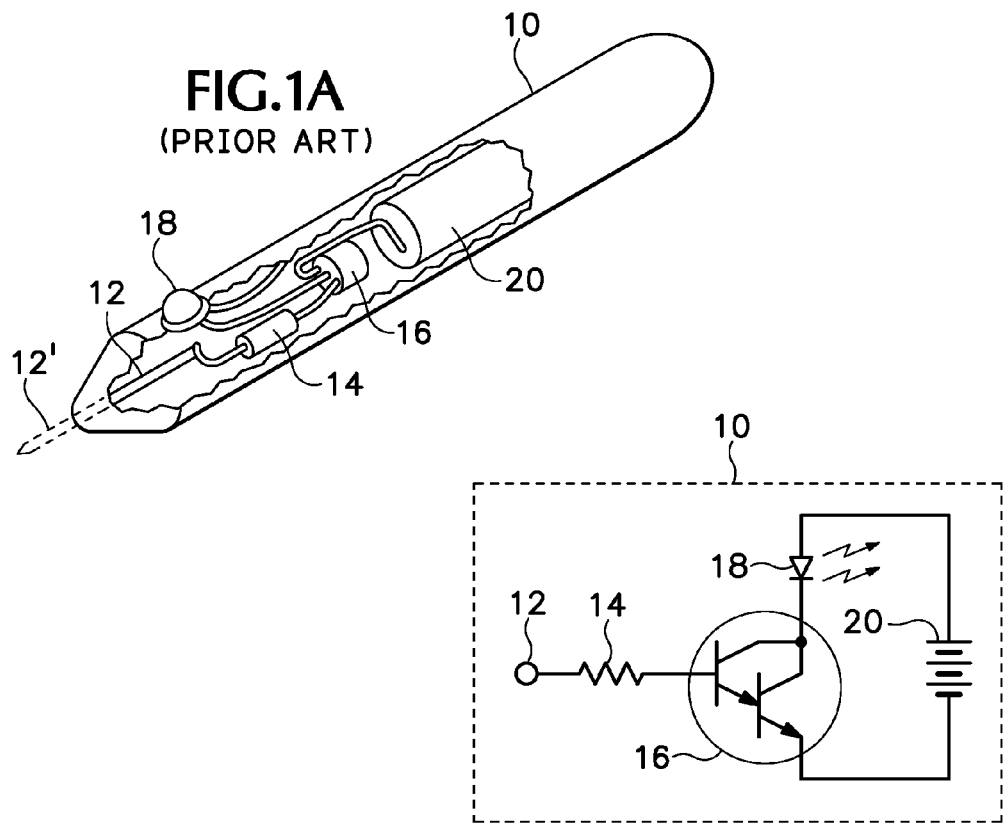
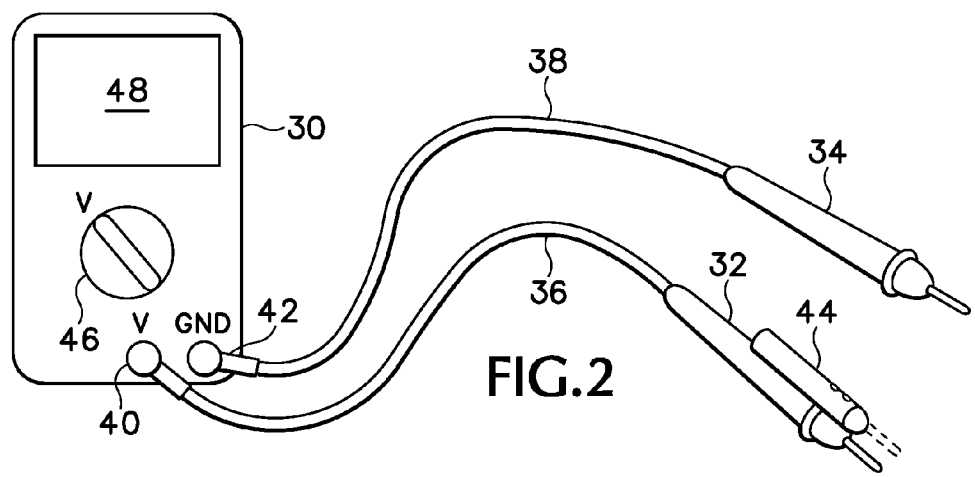

7,242,173 B2

COMBINED TEST INSTRUMENT PROBE AND VOLTAGE DETECTOR

BACKGROUND OF THE INVENTION

This invention relates generally to test instrument probes, and in particular to a combined test instrument probe and voltage detector.

Test instruments such as digital multimeters, analog volt-ohmmeters, oscilloscopes and the like are used to measure electrical parameters such as a.c. and d.c. voltages and currents. Test probes are used to connect test instruments to electrical or electronic circuits so that measurements may be made. A problem exists in situations where an instrument user connects a probe to a potentially dangerous a.c. voltage source and gets no reading when in fact a high voltage is present. This non-reading situation may arise from broken or disconnected test leads, broken a.c. receptacles, or even when the test instrument is in a different measuring mode from that intended. Incorrect readings or an indication that no voltage is present when in fact a dangerous voltage exists may create a dangerous situation for the user relying on the instrument.

Both noncontacting voltage detectors and contacting voltage detectors are well known in the art, and are often referred to as continuity checkers, light pens, volt sticks or wands, or leadless voltage probes. U.S. Pat. No. 3,919,631 issued Nov. 11, 1975, to Brown, and U.S. Pat. No. 5,103,165, issued Apr. 7, 1992, to Siratz, disclose similar noncontacting voltage detectors. U.S. Pat. No. 4,006,409 issued Feb. 1, 1977, to Adams discloses a contacting voltage detector. While quite useful, these devices are easily lost because of their small size, or are simply forgotten when a technician takes a test instrument to measure an electrical circuit.

SUMMARY OF THE INVENTION

A voltage detector, which suitably may be either a non-contacting type or a contacting type, is combined with a test instrument probe to provide an indication of the presence of a.c. voltage when the test instrument probe approaches or comes in contact with a source of a.c. voltage. The test instrument probe includes an elongated probe body with a longitudinal axis along which is disposed a conductive member. A portion of the conductive member extends from the probe body to provide the contacting probe tip. The voltage detector is disposed in juxtaposition to the conductive member within the probe body In one embodiment, a voltage sensor in a noncontacting voltage detector is positioned near the probe tip, and insulated therefrom, to sense an a.c. voltage when the probe tip approaches or contacts an a.c. voltage source. In another embodiment, a electrically conductive contacting tip of a contacting voltage detector is positioned near the probe tip, and may actually be in contact with the probe tip. In both the noncontacting and contacting situations, the voltage detector may be mounted to a test instrument probe, or a unitary structure may be provided wherein the voltage detector and test probe are integrally combined.

BRIEF DESCRIPTION OF THE DRAWINGS

FIG. 1A is a cut-away view of a typical prior art voltage detector;

FIG. 1B is a schematic of a typical prior art voltage detector;

FIG. 2 shows a test instrument with probes;

DETAILED DESCRIPTION OF THE INVENTION

Figure 3A:
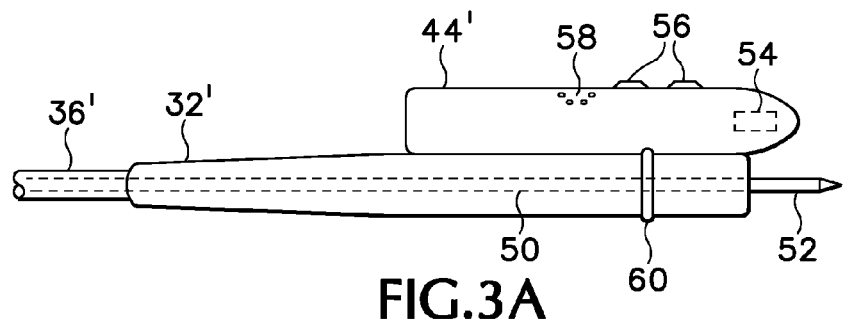
FIG. 3A shows the details of one embodiment of a combined test instrument probe and a noncontacting voltage detector.

Referring to FIG. 1A of the drawings, there is shown a cut-away view of a prior art voltage detector 10, showing the internal components. FIG. 1B is a schematic of the electrical circuit within the voltage detector 10. The following description applies to both FIGS. 1A and 1B. In the case of a noncontacting voltage detector, a sensor element 12 is completely insulated from the external portion of the voltage detector, and senses a.c. electrical fields through capacitive coupling. In the case of a contacting voltage detector, element 12' extends through one end of the voltage detector to form an electrically conductive contacting tip as shown in phantom. The element 12-12' is connected via a resistor 14 to the base of a transistor 16, which is shown as a high-gain Darlington transistor. The collector transistor 16 is connected through a light-emitting diode (LED) 18 to the positive terminal of a battery 20. The emitter of transistor 16 is connected to the negative terminal of battery 20. In operation, when an a.c. voltage field of sufficient magnitude sensed by sensor element 12 switches transistor 16 on in the case of a noncontacting voltage detector, or when electrically conductive tip element 12' comes in contact with an a.c. voltage and switches transistor 16 on in the case of a contacting voltage detector, current provided by battery 20 flows through the transistor 16 and turns on LED 18. This provides a visual indication to the user of the voltage detector 10 that an a.c. voltage is present.

While many improvements have been made to noncontacting voltage detectors and contacting voltage detectors over the years, the operational concept is still the same. Improvements include use of microcircuits and improved LEDs to increase reliability and to allow miniaturization to a smaller size of the overall unit. Sensors may now include miniature coils and magnets to detect electrical fields. Miniature speakers have been added to emit tones as well as light indications when an a.c. voltage field is detected. Also, for noncontacting voltage detectors, blinking lights or different colored LEDs may provide an indication of detected field strength, with a steady light or tone representing the highest a.c. voltage field detected.

FIG. 2 shows a test instrument 30, such as a digital multimeter, having a pair of test probes 32 and 34 connected via test leads 36 and 38 to input receptacles 40 and 42, respectively, which may suitably be volts (V) and ground (GND) inputs to the test instrument 30. A voltage detector 44 is shown mounted to probe 32, which is the voltage probe in this instance. In operation, as the voltage detector 44 is brought near or in contact with an a.c. voltage source, the voltage detector 44 will provide an indication of such. This is beneficial to the user of the instrument 30 in that in the event test lead 36 is broken or disconnected from input receptacle 40, or if a mode selector switch 46 is not in the Volts position, or if a fuse is blown or no reading is otherwise displayed on viewing screen 48, the user will immediately be alerted that something is wrong, allowing him to check his equipment before proceeding. Also, by testing both sides of an a.c. power receptacle, the "hot" side can immediately be detected, ensuring that the test leads are connected correctly.

FIG. 3A shows the details of one embodiment of a combined probe and noncontacting voltage detector. Probe 32' has an elongated body formed of insulative material such as plastic, with a conductive member 50, shown in dashed lines, disposed along a longitudinal axis. A portion of the conductive member 50 extends from one end of the probe body to define an electrically conductive probe tip 52. A wire inside the insulation clad test lead 36', shown in dashed lines, connects to the conductive member 50 near the opposite end of the probe body. A noncontacting voltage detector 44' is mounted in juxtaposition to the longitudinal axis of the probe body, with a sensing element 54, shown in dashed lines, positioned adjacent to, but insulated from, the probe tip 52. One or more LEDs 56 and speaker 58 provide an indication of a detected a.c. voltage field.

Figure 3B:
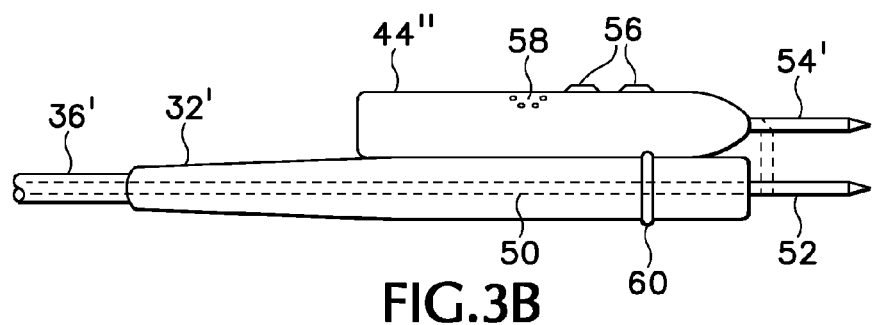
FIG. 3B shows the details of one embodiment of a combined test instrument probe and a contacting voltage detector.

FIG. 3B shows the details of one embodiment of a combined probe and contacting voltage detector. The basic description of this embodiment is similar to that of FIG. 3A, except that instead of an insulated sensing element 54, contacting voltage detector 44" has an electrically conductive tip 54'. Like reference numerals are used for like components. The electrically conducting tip 54' may extend from one end of voltage detector 44" as shown in solid lines, or it may be bent and electrically connected to probe tip 52 as shown in phantom.

There are numerous ways of mounting the voltage detector 44'-44" to the probe 32' to provide a combined test instrument probe and voltage detector, including adhesives, bands, and tape. The finger guard 60 which encircles the probe body may be dished slightly to match the profile of the body of voltage detector 44'-44', or the body voltage detector 44'-44" may have a slot cut in it to accommodate the finger guard 60. The voltage detector 44'-44" may be permanently mounted to the probe 32', or it may be releasably mounted, that is, mounted in such way that it may easily be removed.

Figure 4A:
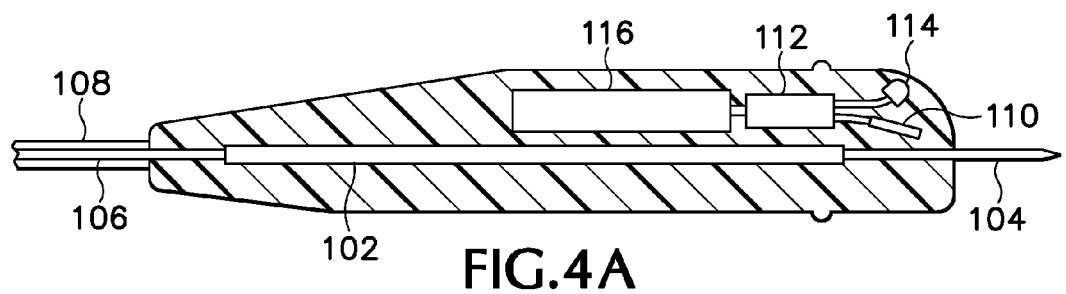
FIG. 4A shows the details of one embodiment of a unitary structure combining a test instrument probe and a noncontacting voltage detector.

FIG. 4A shows the details of an embodiment in which a test instrument probe and noncontacting voltage detector are combined in a unitary structure. The elongated body of probe 100 is shown in a sectional view so that internal details can be seen. A conducting member 102 is disposed along a longitudinal axis, with a conducting probe tip 104 connected to one end, and a wire 106 within an insulation clad test lead 108 connected to other end. A sensing element 110 is positioned adjacent to, and insulated from, electrically conductive probe tip 104. Sensing element 110 is connected to a circuit board 112 which carries the microelectronic detection circuit, and LED 114 is also connected to circuit board 112. LED 114 may either protrude from the body of probe 100, or it may be positioned behind a translucent or transparent window. A battery 116 provides operating power to the detection circuit. While the probe 100 is shown as solid insulative material, such as plastic, encapsulating the voltage detector components, it could just as easily be formed of two halves with a hollow interior to accommodate the voltage detector components.

Figure 4B:
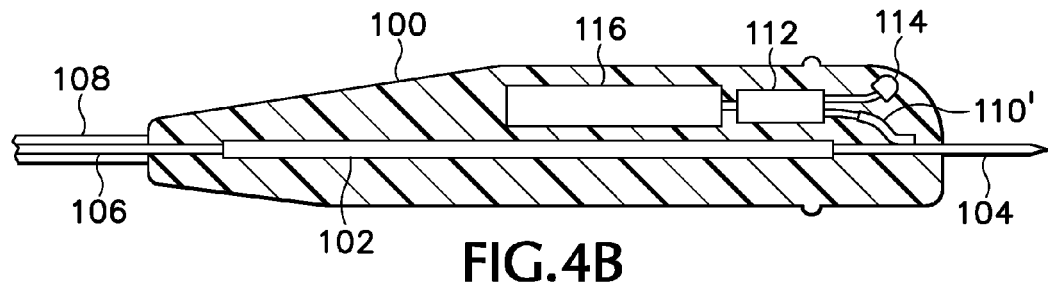
FIG. 4B shows the details of one embodiment of a unitary structure combining a test instrument probe and contacting voltage detector.

FIG. 4B shows the details of an embodiment in which a test instrument probe and contacting voltage detector are combined in a unitary structure. The basic description of this embodiment is similar to that of FIG. 4A, except that instead of a insulated sensing element 110, a sensing element 110' is shown electrically connected to the probe tip 104. Like reference numerals are used for like components.

Figure 5:
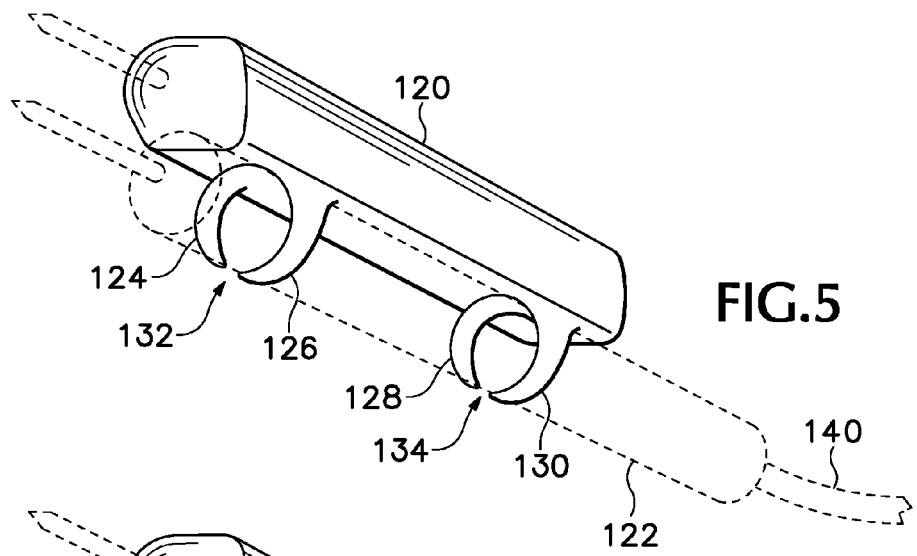
FIG. 5 shows the details of one embodiment of a voltage detector adapted for mounting to a test instrument probe.

FIG. 5 shows the details of a one embodiment of a voltage detector 120 adapted to be mounted on a probe 122, which is shown as dashed lines. Mounting mediums may include an adhesive medium, or one or more annular members in the form of rings or bands. The embodiment shown uses two rings to provide stability. These rings may be complete rings, or split or partial rings. As shown, flexible annular members 124, 126, 128, and 130, which suitably may be molded of plastic to form partial rings 132 and 134 which encircle and grip the probe 122. The opening in the partial rings allow the user to snap the voltage detector 120 over the test lead 140 and slide the voltage detector 120 up onto the probe 122. The partial rings 132 and 134 may be molded integrally with the body of the voltage detector 120, or they may be molded separately and cemented on.

Figure 6:
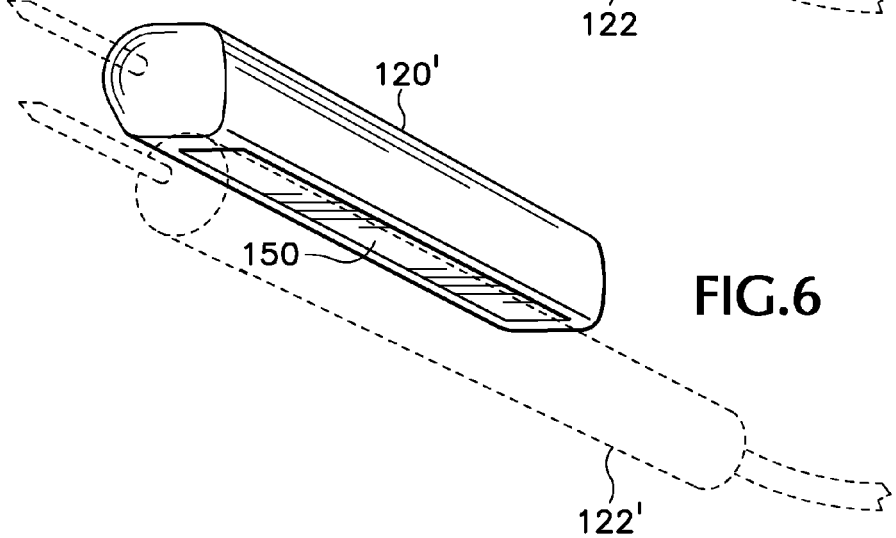
FIG. 6 shows the details of another embodiment of a voltage detector adapted for mounting to a test instrument probe.

FIG. 6 shows the details of another embodiment of a voltage detector 120' adapted to be mounted on a probe 122'. A strip of adhesive 150 is disposed longitudinally along the outer surface of voltage detector 120'. Adhesive 150 may suitably be any of a number of known adhesives, including double-side tape, glue or cement, or silicone adhesive. It is not necessary that adhesive medium 150 be a solid strip, since obviously spots of adhesive disposed along the surface will be just as effective.

While I have shown and described multiple embodiments of a combined test instrument probe and a noncontacting voltage detector, it will be apparent to those skilled in the art that many changes and modifications may be made without departing from the concept taught herein in its broader aspects.

I claim:

1. A test instrument probe, comprising:
    a probe body housing a conductive member, wherein at least a portion of said conductive member defines an electrically conductive probe tip; and
    a voltage detector being mounted on the probe body, said voltage detector having means for detecting a voltage, and a voltage indicator responsive to said detected voltage,
    wherein said means for detecting a voltage is a sensing element coupled to a detector circuit, said sensing element electrically insulated from said conductive member.

2. A test instrument probe in accordance with claim 1 wherein said sensing element is disposed adjacent said electrically conductive probe tip and insulated therefrom.

3. A combined test instrument probe and voltage detector, comprising:
    an elongated probe body having a longitudinal axis;
    a conductive member disposed along said longitudinal axis, wherein at least a portion of said conductive member extends from said probe body to define an electrically conductive probe tip; and a voltage detector disposed in juxtaposition with said conductive member, said voltage detector including means for detecting a voltage, and a voltage indicator responsive to said detected voltage, wherein said means for detecting a voltage is a sensing element coupled to a detector circuit, said sensing element electrically insulated from said conductive member.

4. A combined test instrument probe and voltage detector in accordance with claim 3 wherein said sensing element is disposed adjacent said electrically conductive probe tip and insulated therefrom.

5. A combined test instrument probe and voltage detector in accordance with claim 4 wherein said means for detecting a voltage is an electrically conductive contacting tip coupled to a detector circuit.

* * * * *